United States Patent [19]

White

[11] 4,302,079
[45] Nov. 24, 1981

[54] PHOTOLITHOGRAPHIC PROJECTION APPARATUS USING LIGHT IN THE FAR ULTRAVIOLET

[75] Inventor: Alan D. White, Berkeley Heights, N.J.

[73] Assignee: Bell Telephone Laboratories, Incorporated, Murray Hill, N.J.

[21] Appl. No.: 139,022

[22] Filed: Apr. 10, 1980

[51] Int. Cl.³ .............................................. G02B 17/08
[52] U.S. Cl. ..................................... 350/371; 350/443
[58] Field of Search ............... 350/442, 443, 445, 173, 350/371

[56] References Cited

U.S. PATENT DOCUMENTS

| | | | |
|---|---|---|---|
| 3,536,380 | 10/1970 | Ferguson | 350/442 |
| 4,103,989 | 8/1978 | Rosin | 350/442 |
| 4,171,870 | 10/1979 | Bruning et al. | 350/442 |
| 4,171,871 | 10/1979 | Dill et al. | 350/442 |

OTHER PUBLICATIONS

Dyson, J., "Unit Magnification Optical System without Seidel Aberrations", *JOSA*, vol. 49, No. 7 (Jul. 1959) pp. 713–716.

Wynne, C. G., "A Unit-Power Telescope for Projection Copying", *Optical Instruments and Techniques 1969*, edited by J. H. Dickson, Oriel Press, England, 1970, pp. 429–434.

Born et al., "Stress Birefringence", *Principles of Optics*, McMillan Co., NY, 1965, pp. 703–705.

*Primary Examiner*—R. A. Rosenberger
*Attorney, Agent, or Firm*—Lucian C. Canepa

[57] ABSTRACT

A lens design for submicron photolithography images a mask (21) onto a semiconductor wafer (23) using light in the far ultraviolet. Illustratively, the lens design is a modified Dyson imaging system comprising a thick plano-convex lens (31), a beam splitter, adjacent to the planar surface of the plano-convex lens comprising two right angle prisms (34, 35) separated by a dielectric interface (36), and an aspherical mirror (32) located on the convex side of the lens. Stress-induced birefringence is used to rotate the plane of polarization of the object radiation.

11 Claims, 7 Drawing Figures

PHOTOLITHOGRAPHIC PROJECTION APPARATUS USING LIGHT IN THE FAR ULTRAVIOLET

TECHNICAL FIELD

This invention relates to photolithographic projection and more particularly to a photolithographic projection apparatus using light in the far ultraviolet.

BACKGROUND OF THE INVENTION

The possibility of achieving line widths of one micron or less on semiconductor surfaces with photolithographic projection printers operating in the near ultraviolet (~0.4 microns) seems remote. The state of the art in refracting systems is represented by commercially available step and repeat cameras which are capable of printing 1.5–2 micron lines anywhere within a 14 millimeter diameter field.

Recently, photoresists sensitive to the far ultraviolet (~0.215 microns) have been developed. For a given aperture, halving the wavelength doubles the resolution. Thus, operation with the new photoresists in the far ultraviolet should yield a two-fold reduction in line widths.

Accordingly, efforts have been directed at trying to design a diffraction-limited photolithographic projection apparatus capable of operating in the far ultraviolet (~0.215$\mu$). It was recognized that such apparatus, if available, would be a significant contribution to the field of submicron photolithography.

SUMMARY OF THE INVENTION

In accordance with the principles of the present invention, a photolithographic image projection apparatus, effective to project radiation from an object plane onto an image plane, comprises a beam-splitter plano-convex lens combination and an aspherical mirror.

Illustratively, the beam-splitter plano-convex lens combination comprises a thick plano-convex lens having a beam splitting surface within the lens. The beam-splitter plano-convex lens combination may also comprise a thick plano-convex lens and a beam splitter adjacent to the planar surface of the lens.

The apex of the convex surface of the beam-splitter plano-convex lens combination is located on an optical path from the object plane to the image plane that is normal to the convex surface at its apex. The combination has a first planar surface proximate to the object plane and a second planar surface proximate to the image plane. The aspherical mirror, whose center of curvature is substantially coincident with the center of curvature of the convex surface of the combination, is located on the convex side of the combination and is centered on the above-mentioned optical path.

The distance along the above-mentioned optical path from the first surface of the combination to the apex of the convex surface and the distance along the above-mentioned optical path from the apex to the second surface of the combination are mutually approximately equal to the radius of curvature of the convex surface.

In one embodiment, this invention comprises a modification of the standard Dyson unit magnification imaging system. For field points on axis, the Dyson system is free of all aberrations. However, for field points off axis, monochromatic and color aberrations are present. In the present photolithographic projection system, an aspherical mirror is used to optimize the Dyson system with respect to aberrations so that it is diffraction limited over a finite field at a desired wavelength. In particular, an aspherical mirror has been used to optimize the Dyson system at 0.215$\mu$.

Additional inventive features have been included in the photolithographic projection apparatus in order to solve specific optical design problems which occur in the far ultraviolet. Object radiation transmitted by the beam splitter, which illustratively comprises a dielectric surface, is partially polarized parallel to the plane of incidence. Radiation polarized perpendicular to the plane of incidence is reflected by the beam splitter onto the image plane. Rotation of the plane of polarization of the object radiation is accomplished by applying transverse stress to the plano-convex lens, thereby inducing birefringence. Furthermore, as a result of the degradation of standard optical cements in the far ultraviolet, a flowing index matching fluid is used to provide optical continuity for the system.

BRIEF DESCRIPTION OF THE DRAWINGS

For purposes of clarity, the figures have not been drawn to scale.

DETAILED DESCRIPTION

Applicant's invention comprises a diffraction-limited unit magnification photolithographic projection apparatus having particular applicability to imaging a mask onto a semiconductor wafer using light in the far ultraviolet.

Figure 1:
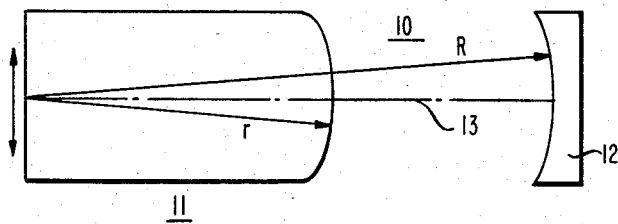
FIG. 1 illustrates a Dyson unit magnification image projection system of the type found in the prior art.

Before treating the inventive subject matter in detail, it is useful to consider the well-known Dyson imaging system illustrated in FIG. 1, [see Dyson, J. "Unit Magnification Optical System Without Seidel Aberrations" *Journal of the Optical Society of America*, Vol. 49, No. 7, page 713, (1959)].

The Dyson system 10 comprises thick plano-convex lens 11 having radius r, index n, and thickness equal to r, and concentric spherical mirror 12 having radius R. The dimension r is chosen so that rays parallel to optical axis 13 are focused at the mirror surface, i.e., $$r = R(n-1)/n$$

The Dyson system shown in FIG. 1 images the object plane back on itself. For photolithographic applications, it is necessary to separate the object plane from the image plane.

Figure 2:
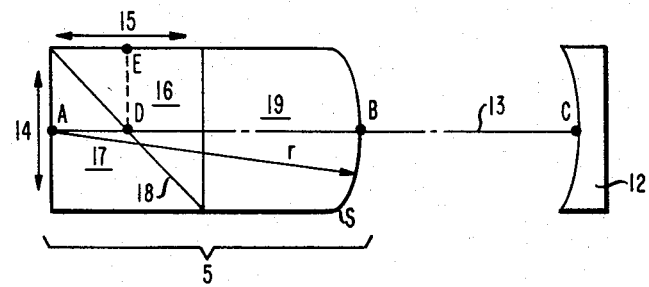
FIG. 2 illustrates a standard Dyson image projection system with the addition of a beam splitter.

FIG. 2 shows the Dyson system of FIG. 1 with the addition of a beam splitter to separate the object and image planes. Corresponding elements in FIGS. 1 and 2 have the same identifying numerals. The system of FIG. 2 is designed to project radiation from object plane 14 onto image plane 15. Beam-splitter plano-convex lens combination 5 comprises thick plano-convex lens 19, having convex surface S, and a beam splitter, adjacent to the planar surface of lens 19, comprising right angle prisms 16 and 17 separated by dielectric interface 18 (see Wynne, C. G., "Unit Power Telescope for Projection Copying", *Optical Instruments and Techniques,* Oriel Press, Ltd. 1970, pages 429–434).

The apex (point B) of plano-convex lens 19 is located on optical path ABCDE of FIG. 2. Optical path ABCDE is the optical path from the object plane to the image plane that is normal to surface S of lens 19 at its apex. Spherical mirror 12 of FIG. 2, whose center of curvature is substantially coincident with the center of curvature of convex surface S, is also centered along the above-mentioned optical path. The radius of curvature of surface S of FIG. 2 is equal to r. Advantageously, paths AB and BDE are also each equal to r.

The Dyson system is free of all aberrations on axis. For field points off axis, however, the useful aperture is limited by both monochromatic and color aberrations.

Figure 3:
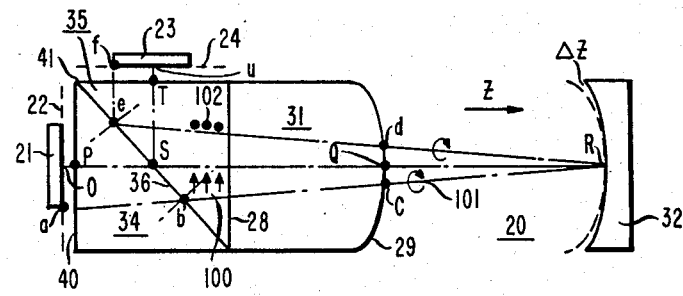
FIG. 3 shows a partly pictorial, partly schematic representation of a photolithographic projection apparatus made in accordance with an illustrative embodiment of the present invention.

FIG. 3 is a partly schematic and partly pictorial representation of an illustrative embodiment of the present invention. The numerical parameters stated in connection with this embodiment of the invention are intended to be illustrative and are not intended as limitations on the scope of the invention.

The optical system 20 illustrated in FIG. 3 is designed to project an image of mask 21 located on object plane 22 onto semiconductor wafer 23 whose bottom surface is located in image plane 24. In this particular embodiment, the object and image planes are perpendicular.

The beam-splitter plano-convex lens combination of the embodiment of the invention illustrated in FIG. 3 comprises thick plano-convex lens 31, having a convex surface 29, and a beam splitter adjacent to the planar surface of lens 31 comprising right angle prisms 34 and 35 separated by dielectric surface 36. The beam splitter has a first surface 40 proximate and parallel to object plane 22 and a second surface 41 proximate and parallel to image plane 24. The apex (point Q) of surface 29 lies on path OQRSU which is the optical path from the object plane to the image plane that is normal to convex surface 29 of FIG. 3 at its apex (point Q). Aspherical mirror 32, whose radius of curvature is substantially coincident with the radius of curvature of convex surface 29, is located on the convex side of the lens and is centered about segment RQ of optical path OQRSU. The distances PQ and QST of FIG. 3 which lie along optical path OQRSU, are mutually approximately equal to the radius of curvature of convex surface 29.

The specific illustrative embodiment of the invention depicted in FIG. 3 is a modified Dyson system optimized to yield diffraction-limited imaging at 0.215$\mu$. The system is optimized by replacing the spherical mirror of the Dyson system with an aspherical mirror capable of correcting the aberrations present in the Dyson system. Illustratively, the lens and beam splitter are made out of fused silica, a material transparent to radiation in the far ultraviolet.

The aspherical surface of the mirror 32 shown in FIG. 3 was designed with a commercially available computerized optimization technique which minimizes the optical path length difference between the axial and nonaxial rays. (See Jamieson, T. H., "Optimazation Techniques In Lens Design", American Elsevier Publishing Company, N.Y., 1971 for a general discussion of these techniques). A computer program suitable for optimizing the design of the aspherical surface is designated ACCOS V and is available from Scientific Calculations, Incorporated, Fisher, New York.

When the system shown in FIG. 3 is optimized for radiation at 0.215$\mu$, the following is one set of desirable parameters.

$PQ = 172.1284$ mm $QR = 327.1383$ mm $PR = PQ + QR = 499.2667$ mm and path $RQST = PR = 499.2667$ mm By way of example, object plane 22 in FIG. 3 is separated from surface 40 by 1 mm and image plane 24 is separated from surface 41 by 1 mm. The radius of curvature of the convex surface is $-175.1773$ mm.

The aspherical surface of the mirror 32 (FIG. 3) is described by the following equation:

$$\Delta Z = \frac{C\rho^2}{(1 - C^2\rho^2)^{\frac{1}{2}}} - \left[ \frac{C\rho^2}{(1 - C^2\rho^2)^{\frac{1}{2}}} + D\rho^4 + E\rho^6 + F\rho^8 + G\rho^{10} \right].$$

Figure 5:
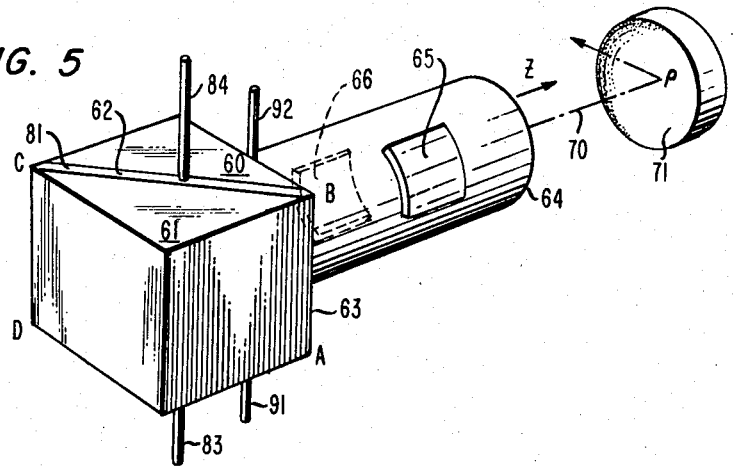
FIG. 5 is a pictorial representation of the photolithographic projection apparatus of FIG. 3.

$C = 0.00200$
$D = 7.53 \times 10^{-12}$
$E = 1.603 \times 10^{-17}$
$F = -2.172 \times 10^{-20}$
$G = 1.931 \times 10^{-24}$ Z represents distance along the direction parallel to segment RQ of FIG. 3 and $\rho$ is a radial coordinate on the surface of the mirror. $\rho$ is shown in FIG. 5. $\Delta Z$ is the deviation in the Z direction of a point on the surface of the aspherical mirror from a spherical surface whose curvature is C. C equals 0.002 mm$^{-1}$ for the aforementioned set of parameters.

If the constants D, E, F, and G were zero, $\Delta Z$ would vanish, and the mirror would be spherical. $\Delta Z$ can therefore be taken as a measure of the asphericity of the mirror.

The aforespecified illustrative lens design achieved in accordance with the principles of the present invention is diffraction limited at f/2 over a 14.2 mm diameter field.

The above parameters are optimum for radiation at 0.215 $\mu$m. By applying the aforementioned computerized optimization techniques, the lens system can be reoptimized for other desirable wavelengths in a straightforward manner.

The operation of the image projection system illustrated in FIG. 3 is as follows. Radiation passing through mask 21 at point a is partially transmitted by the beam splitter at point b on interface 36. Since the beam splitter is a dielectric surface, radiation transmitted by the beam splitter is partially polarized parallel to the plane of incidence (plane of FIG. 3) as is indicated by arrows 100. Since dielectric surface 36 will only reflect radiation polarized perpendicular to the plane of incidence onto the image plane, it is necessary to rotate the plane of polarization of the radiation 90 degrees prior to reflection at surface 36. If the plane of polarization is not rotated, the exposure time must be substantially increased because only a small percent of the object radiation transmitted by the beam splitter at point b of FIG. 3 is perpendicularly polarized. At visible wavelengths, a quarter-wave plate would be interposed between the beam splitter and the mirror to accomplish this task (see Bruning, J. H. et al, U.S. Pat. No. 4,171,870, issued Oct. 23, 1979.) Quarter-wave plates typically used in the visible are either not transparent to radiation in the far ultraviolet (mica) or difficult to fabricate at the 75 mm diameter of the present lens (crystal quartz).

This problem is preferably overcome by inducing sufficient birefringence in plano-convex lens 31 of FIG. 3 to cause quarter-wave retardation of the radiation passing through the lens (see Born, M. and Wolf, E., "Principles Of Optics", MacMillan Co., New York, 1964, pages 703–705 for a general discussion of stress-induced birefringence).

Figure 4:
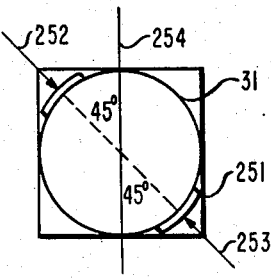
FIG. 4 shows a front view of the embodiment of the invention illustrated in FIG. 3 as well as the direction of the stress which induces birefringence.

Birefringence is induced in the plano-convex lens 31 of FIG. 3 by the application of stress transverse to the Z direction and at 45 degrees to the plane of FIG. 3. The direction of the stress is shown schematically in FIG. 4. FIG. 4 is a front view of the embodiment of the invention shown in FIG. 3. Plano-convex lens 31 is stressed at 45 degrees to plane 254 (plane of FIG. 3) as indicated by arrows 252 and 253. Beam splitter 251 is behind plano-convex lens 31. In practice, the stress is applied, for example, with a hydraulic vise.

After radiation passes through the lens 31 at S, it is circularly polarized as shown by circle 101 of FIG. 3. The radiation reflects off mirror 32 and reenters the convex lens at d. While traveling through the lens, the circularly polarized light becomes plane polarized light, polarized perpendicular to the plane of incidence (plane of FIG. 3) as shown by the dots 102 of FIG. 3. The perpendicularly polarized light is reflected off the beam splitter at e onto the image plane at f.

FIG. 5 is a three-dimensional representation of the embodiment of the invention illustrated in FIG. 3. The beam splitter comprises right angle prisms 60 and 61 separated by dielectric interface 62. Plano-convex lens 64 is stressed by jaws 65 and 66 of a hydraulic vise. The lens is centered about optical axis 70 as is aspherical mirror 71. The Z direction is along the optical axis 70 and ρ is a radial coordinate on the surface of the mirror.

At visible wavelengths, the interface between the prisms comprising the beam splitter (interface 62 of FIG. 5) and the interface between the beam splitter and the lens (interface 63 of FIG. 5) would be optically cemented. However, at wavelengths in the far ultraviolet, all standard optical cements degrade. To mitigate this problem, so-called flowing liquid gates advantageously may be used to form the aforementioned interfaces in this embodiment. The flowing liquid gates each comprise a flowing solution index matched to the lens and beam splitter. When suitable cements become available, this expedient will become unnecessary.

The flowing liquid gate within the beam splitter of FIG. 5 is constructed by cementing edges AB and CD. Glass plate 81 is cemented along BC. A similar glass plate (not shown) is cemented along AD. Tubes 83 and 84 are inserted into holes in the glass plates, and an index matching solution of water and glycerin flows through the interface. A similar arrangement is used between the lens and the beam splitter (interface 63 of FIG. 5) as indicated by tubes 91 and 92.

Figure 6:
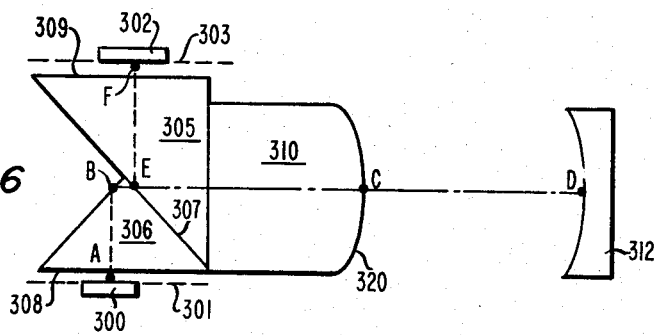
FIG. 6 shows a partly pictorial, partly schematic representation of an alternate embodiment of the present invention.

FIG. 6 shows an alternative embodiment of the present invention. This embodiment of the invention is designed to project an image of mask 300 located on object plane 301 onto semiconductor wafer 302 located on image plane 303. In this particular embodiment of the invention, the object and image planes are parallel.

The embodiment of the invention illustrated in FIG. 6 has a beam-splitter plano-convex lens combination comprising thick plano-convex lens 310, having convex surface 320, and a beam splitter, adjacent to the planar surface of the lens, comprising right angle prism 305 and roof prism 306 separated by dielectric interface 307 which may include a flowing liquid gate. The apex (point C) of convex surface 320 of FIG. 6 lies along segment BD of optical path ABCDEF. This optical path is the optical path from the object plane to the image that is perpendicular to convex surface 320 at its apex. Aspherical mirror 312, whose center of curvature is substantially coincident with the center of curvature of convex surface 320, is located on the convex side of lens 310 and is centered around segment CD of path ABCDEF.

Advantageously, the distance along path ABCDEF from surface 308 to the apex of surface 320 (point C) and the distance along path ABCDEF from the apex of surface 320 to surface 309 are mutually approximately equal to the radius of curvature of surface 320. Operation of this embodiment of the invention in analogous to the operation of the embodiment shown in FIG. 3. Rotation of the plane of polarization of the object radiation is accomplished by the application of transverse stress to plano-convex lens 310, thereby inducing birefringence.

Figure 7:
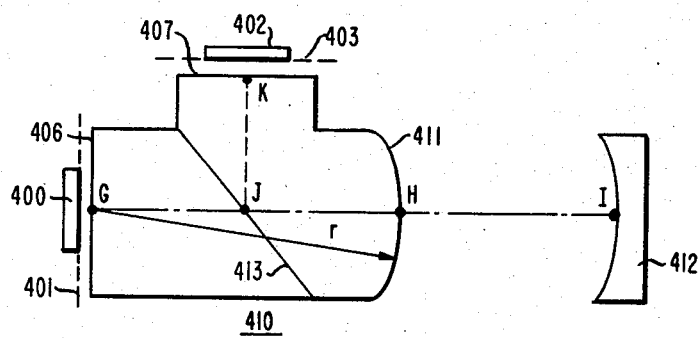
FIG. 7 shows a partly pictorial, partly schematic representation of a second alternative embodiment of the present invention.

A further illustrative embodiment of the invention is shown in FIG. 7. This particular embodiment is designed to project an image of mask 400 located on object plane 401 onto semiconductor wafer 402 located on image plane 403.

The image projection system of FIG. 7 has a beam-splitter plano-convex lens combination comprising a thick plano-convex lens 410, of radius r, index n and thickness approximately equal to r. Included within lens 410 is beam-splitting surface 413. The apex of convex surface 411 (point H) lies on optical path GHIJK. Path GHIJK is the optical path from surface 406 to surface 407 that is normal to convex surface 411 at its apex (point H). Aspherical mirror 412 is also located on this path. Advantageously, path HJK is approximately equal to the radius of curvature of surface 411.

Finally, it is to be understood that the above-described arrangements and procedures are only illustrative of the application of the principles of the present invention. In accordance with those principles, numerous other structural configurations may be devised by those skilled in the art without departing from the spirit and scope of the invention.

What is claimed is:

1. An image projection apparatus for radiation in the far ultraviolet, effective to project radiation from an object plane onto an image plane, comprising:
a polarizing beam-splitter plano-convex lens combination, the convex surface of said combination having its apex located on an optical path from said object plane to said image plane that is normal to said convex surface at its apex, said combination having a first planar surface proximate to said object plane, and a second planar surface proximate to said image plane;

an aspherical mirror, whose center of curvature is substantially coincident with the center of curvature of said convex surface, located on the convex side of said combination and centered on said optical path; and means for inducing sufficient birefringence into said lens to cause quarter-wave retardation of radiation traversing the lens;

the distance along said optical path between said first surface and said apex of said second convex surface and the distance along said path from said apex of said convex surface to said second surface being mutually approximately equal to the radius of curvature of said convex surface.

2. The image projection apparatus of claim 1 wherein said combination comprises a thick plano-convex lens having a beam splitting surface within said lens.

3. The image projection apparatus of claim 1 wherein said combination comprises a thick plano-convex lens and a polarizing beam-splitter adjacent to the planar surface of said lens.

4. The image projection system of claim 1 wherein said birefringence is induced by applying a transverse stress to said plano-convex lens.

5. The image projection apparatus of claim 3 wherein said image plane and said object plane are perpendicular, and
said beam splitter includes two right angle prisms separated by a dielectric interface.

6. The image projection apparatus of claim 3 wherein said image plane and said object plane are parallel and said beam splitter includes a right angle prism and a roof prism separated by a dielectric interface.

7. An image projection apparatus for radiation in the far ultraviolet, effective to project radiation from an object plane onto a perpendicular plane forming an image plane, comprising:
a thick plano-convex lens, the convex surface of said lens having its apex located on an optical path from said object plane to said image plane that is normal to said convex surface at its apex, an aspherical mirror, whose center of curvature is substantially coincident with the center of curvature of said convex surface, located on the convex side of said lens and centered on said optical path, a polarizing beam splitter, adjacent to the planar surface of said lens, comprising a first right angle prism having a first planar surface proximate and parallel to said object plane, and a second right angle prism having a second planar surface proximate and parallel to said image plane, said prisms being separated by a flowing liquid gate, and means for inducing sufficient birefringence into said plano-convex lens to cause quarter-wave retardation of radiation traversing said lens;

the distance along said optical path between said first surface and said apex of said convex surface and the distance along said path from said apex to said second surface being mutually approximately equal to the radius of curvature of said convex surface.

8. The image projection apparatus of claim 7 wherein said means for inducing said birefringence includes the application of a transverse stress to said lens.

9. The image projection apparatus of claim 7 wherein said flowing liquid is an index matching solution of water and glycerin.

10. The image projection apparatus of claim 7 wherein said plano-convex lens and said beam splitter are each made of fused silica.

11. An image projection apparatus for radiation in the far ultraviolet, effective to project radiation from an object plane onto an image plane, comprising:
a polarizing beam-splitter plano-convex lens combination, said combination having a first planar surface proximate to said object plane and a second planar surface proximate to said image plane;

an aspherical mirror, located on the convex side of said combination, having a center of curvature substantially coincident with the center of curvature of the convex surface of said combination; and means for inducing sufficient birefringence into said lens to cause quarter-wave retardation of radiation traversing the lens.

* * * * *